US012720782B2

(12) United States Patent
Hanagata

(10) Patent No.: US 12,720,782 B2
(45) Date of Patent: Aug. 25, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shoko Hanagata, Komatsu Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 753 days.

(21) Appl. No.: 17/940,476

(22) Filed: Sep. 8, 2022

(65) Prior Publication Data

US 2023/0299187 A1 Sep. 21, 2023

(30) Foreign Application Priority Data

Mar. 18, 2022 (JP) ................................ 2022-044513

(51) Int. Cl.
*H10D 12/00* (2025.01)
*H10D 8/00* (2025.01)
*H10D 62/10* (2025.01)

(52) U.S. Cl.
CPC ............ *H10D 12/481* (2025.01); *H10D 8/00* (2025.01); *H10D 62/127* (2025.01)

(58) Field of Classification Search
CPC ........ H10D 8/00; H10D 8/422; H10D 12/411; H10D 62/393; H10D 62/125;
(Continued)

(56) References Cited

U.S. PATENT DOCUMENTS 6,388,306 B1 5/2002 Hirano et al.
6,552,413 B1 4/2003 Hirano et al.
(Continued)

FOREIGN PATENT DOCUMENTS

JP H07-147418 A 6/1995
JP H10-093113 A 4/1998
(Continued)

OTHER PUBLICATIONS

Notice of Reasons for Refusal (Office Action) mailed Mar. 26, 2025 in corresponding Japanese Patent Application No. 2022-044513 with English machine translation, 15 pages.
(Continued)

*Primary Examiner* — Julio J Maldonado
*Assistant Examiner* — Paul A Berry
(74) *Attorney, Agent, or Firm* — Kim & Stewart LLP

(57) ABSTRACT

A semiconductor device includes first to second electrodes, and first to fifth semiconductor regions. The second semiconductor region is located on the first semiconductor region and is of the first conductivity type. The third semiconductor region is located on a portion of the second semiconductor region and is of the first conductivity type. The third semiconductor region has a higher first-conductivity-type impurity concentration than the second semiconductor region. The fourth semiconductor region is located on the second and third semiconductor regions and is of a second conductivity type. The fifth semiconductor region is located on a portion of the fourth semiconductor region and is of the second conductivity type. The fifth semiconductor region has a higher second-conductivity-type impurity concentration than the fourth semiconductor region. At least a portion of the fifth semiconductor region is positioned above at least a portion of the third semiconductor region.

17 Claims, 14 Drawing Sheets

(58) Field of Classification Search
CPC .. H10D 62/128; H10D 62/129; H10D 62/378; H10D 62/60; H10D 12/481; H10D 62/127; H10D 62/126; H10D 64/117; H10D 62/10; H10D 48/38; H10D 62/834; H10D 8/041; H10D 8/20; H10D 12/212; H10D 12/417; H10D 12/418; H10D 12/461
See application file for complete search history.

(56) References Cited

U.S. PATENT DOCUMENTS 9,064,779 B2 6/2015 Mizukami et al.
2008/0265276 A1* 10/2008 Noda .................. H10D 12/481 257/E29.197
2012/0286290 A1 11/2012 Uchida
2015/0001552 A1* 1/2015 Hori .................. H10D 62/8325 257/77
2015/0069414 A1* 3/2015 Kono ...................... H10D 8/60 438/510
2016/0268252 A1 9/2016 Saito
2020/0091295 A1* 3/2020 Ohashi ................ H10D 62/393
2021/0376168 A1 12/2021 Tanihira et al.

FOREIGN PATENT DOCUMENTS

JP 2001-196606 A 7/2001
JP 2001-210651 A 8/2001
JP 2011-151208 A 8/2011
JP 2013021240 A 1/2013
JP 2015029046 A 2/2015
JP 2016162897 A 9/2016
JP 2020-047683 A 3/2020
JP 2021190573 A 12/2021

OTHER PUBLICATIONS

Notice of Reasons for Refusal mailed Jun. 4, 2025 in corresponding Japanese Patent Application No. 2022-044513, 10 pages (with Translation).
First Office Action dated Jun. 10, 2026, mailed in counterpart Chinese Application No. 202210943334.7, 18 pages.

* cited by examiner

IF190
IF100
IF191
I(A)
0
0
V(V)

SEMICONDUCTOR DEVICE

CROSS-REFERENCE TO RELATED APPLICATIONS

This application is based upon and claims the benefit of priority from Japanese Patent Application No. 2022-044513, filed on Mar. 18, 2022; the entire contents of which are incorporated herein by reference.

FIELD

Embodiments relate to a semiconductor device.

BACKGROUND

For example, a semiconductor device that includes a diode is used in applications such as power conversion and the like. The voltage that is generated in the diode may oscillate in recovery when the diode transitions from the on-state to the off-state.

DETAILED DESCRIPTION

Figure 1:
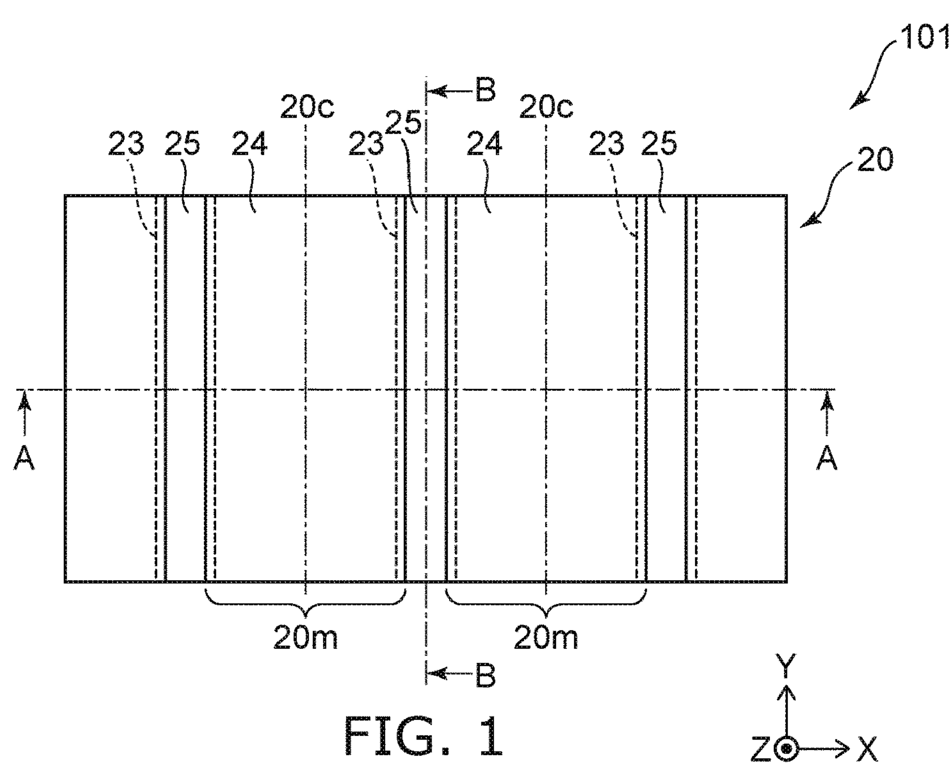
FIG. 1 is a schematic plan view illustrating a semiconductor device according to a first embodiment.

A semiconductor device according to one embodiment, includes a first electrode, a first semiconductor region, a second semiconductor region, a third semiconductor region, a fourth semiconductor region, a fifth semiconductor region, and a second electrode. The first semiconductor region is located on the first electrode and electrically connected with the first electrode. The first semiconductor region is of a first conductivity type. The second semiconductor region is located on the first semiconductor region. The second semiconductor region is of the first conductivity type. The second semiconductor region has a lower first-conductivity-type impurity concentration than the first semiconductor region. The third semiconductor region is located on a portion of the second semiconductor region. The third semiconductor region is of the first conductivity type. The third semiconductor region has a higher first-conductivity-type impurity concentration than the second semiconductor region. The fourth semiconductor region is located on the second semiconductor region and on the third semiconductor region. The fourth semiconductor region is of a second conductivity type. The fifth semiconductor region is located on a portion of the fourth semiconductor region. The fifth semiconductor region is of the second conductivity type. The fifth semiconductor region has a higher second-conductivity-type impurity concentration than the fourth semiconductor region. at least a portion of the fifth semiconductor region is positioned above at least a portion of the third semiconductor region. The second electrode is located on the fifth semiconductor region and electrically connected with the fifth semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the embodiments described below, each embodiment may be implemented by inverting the p-type (an example of the second conductivity type) and the n-type (an example of the first conductivity type) of each semiconductor region.

First Embodiment

FIG. 1 is a schematic plan view illustrating a semiconductor device according to a first embodiment.

Figure 2:
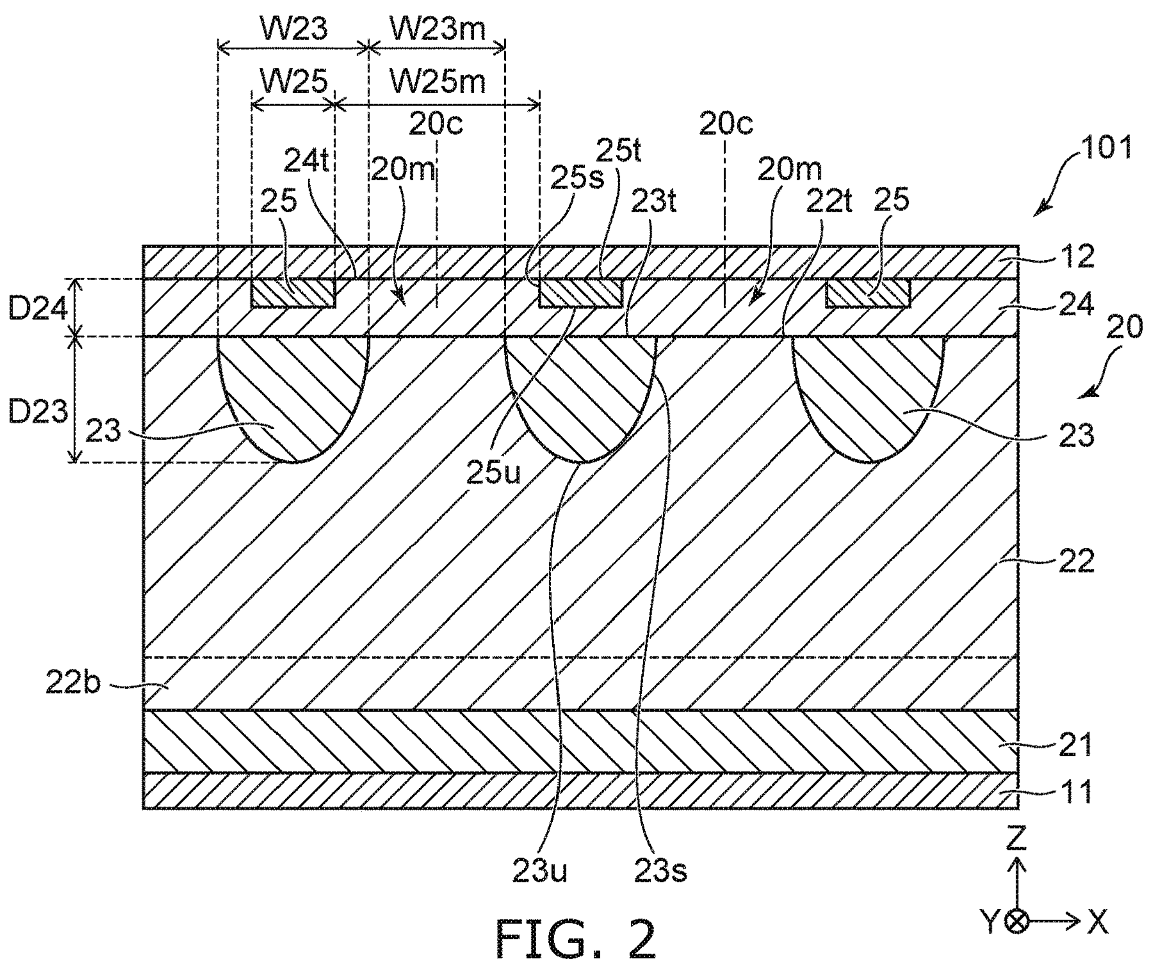
FIG. 2 is a schematic cross-sectional view illustrating the semiconductor device according to the first embodiment.

FIG. 2 is a schematic cross-sectional view illustrating the semiconductor device according to the first embodiment.

Figure 3:
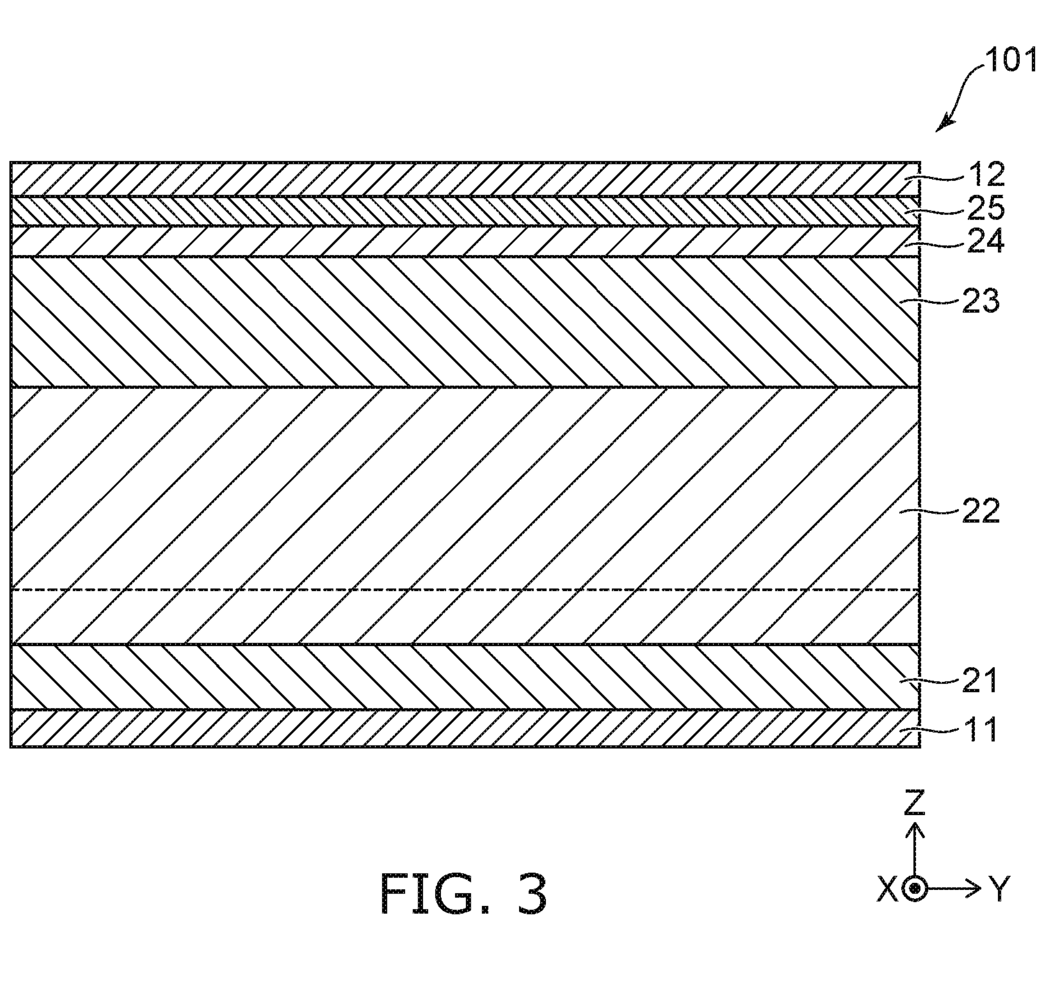
FIG. 3 is a schematic cross-sectional view illustrating the semiconductor device according to the first embodiment.

FIG. 3 is a schematic cross-sectional view illustrating the semiconductor device according to the first embodiment.

The semiconductor device 101 according to the embodiment illustrated in FIGS. 1 to 3 is, for example, a diode. FIG. 2 corresponds to a line A-A cross section illustrated in FIG. 1. FIG. 3 corresponds to a line B-B cross section illustrated in FIG. 1.

As illustrated in FIG. 2, the semiconductor device 101 includes a first electrode 11, a semiconductor layer 20, and a second electrode 12. The semiconductor layer 20 is, for example, a semiconductor substrate. The semiconductor layer 20 is located between the first electrode 11 and the second electrode 12. The semiconductor layer 20 includes a first semiconductor region 21 (a cathode region), a second semiconductor region 22 (a drift region), a third semiconductor region 23, a fourth semiconductor region 24 (an anode region), and a fifth semiconductor region 25 (a contact region). In FIG. 1, the second electrode 12 is not illustrated, and the position of the third semiconductor region 23 under the fourth semiconductor region 24 is shown by a broken line.

In the following description, the direction from the first electrode 11 toward the second electrode 12 is taken as a Z-direction. The Z-direction is, for example, a direction perpendicular to the upper surface of the first electrode 11. The Z-direction corresponds to the direction from the first semiconductor region 21 toward the fourth semiconductor region 24. Two mutually-orthogonal directions perpendicular to the Z-direction are taken as an X-direction and a Y-direction. In the description, the direction from the first electrode 11 toward the second electrode 12 is called "up", and the opposite direction is called "down". That is, the second electrode 12 side is taken to be the upper side, and the first electrode 11 side is taken to be the lower side. These directions are based on the relative positional relationship between the first electrode 11 and the second electrode 12 and are independent of the direction of gravity.

The first electrode 11 is, for example, a back electrode located at substantially the entire back surface (the lower surface) of the semiconductor layer 20. The first semiconductor region 21 is located on the first electrode 11 and electrically connected with the first electrode 11. For example, the first semiconductor region 21 contacts the upper surface of the first electrode 11. The first semiconductor region 21 is of a first conductivity type (e.g., an n-type).

The second semiconductor region 22 is located on the first semiconductor region 21 and electrically connected with the first semiconductor region 21. The second semiconductor region 22 contacts (is continuous with) the first semiconductor region 21. The second semiconductor region 22 is of the first conductivity type. The first-conductivity-type impurity concentration of the second semiconductor region 22 is less than the first-conductivity-type impurity concentration of the first semiconductor region 21.

As in FIG. 2, a semiconductor region **22*b* (a buffer region) may be located between the second semiconductor region 22 and the first semiconductor region 21. The semiconductor region 22*b* contacts the first and second semiconductor regions 21 and 22 and electrically connects the first semiconductor region 21 and the second semiconductor region 22. The semiconductor region 22*b* is of the first conductivity type. The first-conductivity-type impurity concentration of the semiconductor region 22*b* is less than the first-conductivity-type impurity concentration of the first semiconductor region 21 and greater than the first-conductivity-type impurity concentration of the second semiconductor region 22**.

The third semiconductor region 23 is located on a portion of the second semiconductor region 22 and electrically connected with the second semiconductor region 22. As illustrated in FIG. 2, a bottom surface **23*u* and a side surface 23*s* of the third semiconductor region 23 contact the second semiconductor region 22. The side surface 23*s* crosses the X-direction and extends in the Y-direction. An upper surface 23*t* of the third semiconductor region 23 is continuous with an upper surface 22*t* of the second semiconductor region 22. The Z-direction position of the upper surface 23*t* may be equal to the Z-direction position of the upper surface 22*t*. The third semiconductor region 23 is of the first conductivity type. The first-conductivity-type impurity concentration of the third semiconductor region 23 is greater than the first-conductivity-type impurity concentration of the second semiconductor region 22. The first-conductivity-type impurity concentration of the third semiconductor region 23 may be less than the first-conductivity-type impurity concentration of the first semiconductor region 21**.

Although not particularly limited, the first-conductivity-type impurity concentration of the third semiconductor region 23 is, for example, not less than 10 times and not more than 500 times the first-conductivity-type impurity concentration of the second semiconductor region 22. The first-conductivity-type impurity concentration of the third semiconductor region 23 is, for example, not less than $1\times10^{15}$ atoms/cm$^3$ (atoms/cubic centimeter) and not more than $5\times10^{16}$ atoms/cm$^3$.

Multiple third semiconductor regions 23 are included in the example. The multiple third semiconductor regions 23 are periodically arranged along the X-direction. Each third semiconductor region 23 extends in the Y-direction.

The fourth semiconductor region 24 is located on the second semiconductor region 22 and on the third semiconductor region 23. The fourth semiconductor region 24 is electrically connected with the second and third semiconductor regions 22 and 23. As illustrated in FIG. 2, the fourth semiconductor region 24 contacts the upper surface **22*t* of the second semiconductor region 22 and the upper surface 23*t* of the third semiconductor region 23. The fourth semiconductor region 24** is of a second conductivity type (e.g., a p-type).

The fifth semiconductor region 25 is located on a portion of the fourth semiconductor region 24 and electrically connected with the fourth semiconductor region 24. As illustrated in FIG. 2, a bottom surface **25*u* and a side surface 25*s* of the fifth semiconductor region 25 contact the fourth semiconductor region 24. The side surface 25*s* crosses the X-direction and extends in the Y-direction. An upper surface 25*t* of the fifth semiconductor region 25 is continuous with an upper surface 24*t* of the fourth semiconductor region 24. The Z-direction position of the upper surface 25*t* may be equal to the Z-direction position of the upper surface 24*t*. The fifth semiconductor region 25 is of the second conductivity type. The second-conductivity-type impurity concentration of the fifth semiconductor region 25 is greater than the second-conductivity-type impurity concentration of the fourth semiconductor region 24**.

Although not particularly limited, the second-conductivity-type impurity concentration of the fifth semiconductor region 25 is, for example, not less than 10 times and not more than 200 times the second-conductivity-type impurity concentration of the fourth semiconductor region 24. The second-conductivity-type impurity concentration of the fifth semiconductor region 25 is, for example, not less than $1\times10^{17}$ atoms/cm$^3$ and not more than $1\times10^{19}$ atoms/cm$^3$.

At least a portion of the fifth semiconductor region 25 is positioned above at least a portion of the third semiconductor region 23. In other words, at least a portion of the fifth semiconductor region 25 overlaps at least a portion of the third semiconductor region 23 when viewed along the Z-direction.

Multiple fifth semiconductor regions 25 are included in the example. The multiple fifth semiconductor regions 25 are periodically arranged along the X-direction. Each fifth semiconductor region 25 extends in the Y-direction. The period at which the multiple fifth semiconductor regions 25 are arranged in the X-direction may be equal to the period at which the multiple third semiconductor regions 23 are arranged in the X-direction. In other words, the third semiconductor region 23 extends along the fifth semiconductor region 25. The length along the Y-direction of the third semiconductor region 23 may be equal to the length along the Y-direction of the fifth semiconductor region 25.

At least a portion of each of the multiple fifth semiconductor regions 25 is positioned above at least a portion of each of the multiple third semiconductor regions 23. That is, one third semiconductor region 23 is located above one fifth semiconductor region 25. As illustrated in FIG. 1 or FIG. 2, the third semiconductor regions 23 are not located below centers 20*c* of regions 20*m* between mutually-adjacent fifth semiconductor regions 25. In other words, the third semiconductor regions 23 are not arranged with (do not overlap) the centers 20*c* in the Z-direction. For example, the third semiconductor region 23 is located only under the fifth semiconductor region 25. The center 20*c* is a line that extends in the Y-direction and passes through the midpoint of the shortest line segment connecting the fifth semiconductor regions 25 that are next to each other when viewed from above as in FIG. 1.

The second electrode 12 is located on the fourth semiconductor region 24 and on the fifth semiconductor region 25 and electrically connected with the fourth and fifth semiconductor regions 24 and 25. As illustrated in FIG. 2, the lower surface of the second electrode 12 contacts the upper surface 24*t* of the fourth semiconductor region 24 and the upper surface 25*t* of the fifth semiconductor region 25. For example, the contact between the second electrode 12 and the fourth semiconductor region 24 is a Schottky contact, and the contact between the second electrode 12 and the fifth semiconductor region 25 is an ohmic contact.

Examples of the materials of the components of the semiconductor device 101 will now be described.

The first semiconductor region 21, the second semiconductor region 22, the third semiconductor region 23, the fourth semiconductor region 24, and the fifth semiconductor region 25 include silicon, silicon carbide, gallium nitride, or gallium arsenide as semiconductor materials. When silicon is used as the semiconductor material, arsenic, phosphorus, or antimony can be used as the n-type impurity. Boron can be used as the p-type impurity. For example, the third semiconductor region 23, the fourth semiconductor region 24, and the fifth semiconductor region 25 can be formed by ion implantation of impurities.

The first electrode 11 and the second electrode 12 include conductive materials such as metals, etc. For example, the first electrode 11 and the second electrode 12 include at least one of aluminum, titanium, or tungsten. For example, the second electrode 12 includes aluminum and silicon. Or, the second electrode 12 includes titanium or tungsten.

Operations of the semiconductor device 101 will now be described.

When a positive voltage with respect to the first electrode 11 is applied to the second electrode 12, a forward voltage is applied to the p-n junction between the second semiconductor region 22 and the fourth semiconductor region 24 and to the p-n junction between the third semiconductor region 23 and the fourth semiconductor region 24. Holes are injected from the fifth semiconductor region 25 into the second semiconductor region 22 (and the third semiconductor region 23) via the fourth semiconductor region 24; and electrons are injected from the first semiconductor region 21 into the second semiconductor region 22. A current flows from the second electrode 12 toward the first electrode 11; and the semiconductor device 101 is set to the on-state. In the on-state, holes and electrons accumulate in the second semiconductor region 22; and the electrical resistance of the second semiconductor region 22 is greatly reduced.

Subsequently, when a positive voltage with respect to the second electrode 12 is applied to the first electrode 11, the current that was flowing from the second electrode 12 toward the first electrode 11 is blocked; and the semiconductor device 101 is switched to the off-state. The holes that accumulated in the second semiconductor region 22 pass through the fifth semiconductor region 25 and are discharged to the second electrode 12. The electrons that accumulated in the second semiconductor region 22 pass through the first semiconductor region 21 and are discharged to the first electrode 11. A depletion layer spreads from the p-n junction surface between the second semiconductor region 22 and the fourth semiconductor region 24 toward the second semiconductor region 22 according to the voltage. The breakdown voltage is maintained by the depletion layer spreading in the second semiconductor region 22.

Effects of the embodiment will now be described.

In the semiconductor device 101 according to the embodiment as described above, at least a portion of the fifth semiconductor region 25 is positioned above at least a portion of the third semiconductor region 23. In other words, at least a portion of the third semiconductor region 23 is located below the fifth semiconductor region 25. The oscillation of the voltage (the recovery voltage) generated between the first electrode 11 and the second electrode 12 in recovery when the semiconductor device 101 (the diode) is switched from the on-state to the off-state can be suppressed thereby, and the recovery characteristics can be improved. It is considered that this is because, for example, by including the third semiconductor region 23, the rate of the spreading of the depletion layer from the p-n junction surface toward the second semiconductor region 22 in recovery is suppressed. For example, by including the third semiconductor region 23, the time until the depletion layer reaches the first semiconductor region 21 (or the semiconductor region 22*b*) is increased. Thereby, for example, the carriers take time to be discharged from the second semiconductor region 22; an abrupt change of the potential difference between the first electrode 11 and the second electrode 12 in recovery is suppressed; and a soft recovery occurs.

On the other hand, there is a risk that the conduction characteristics in the on-state may be affected when the third semiconductor region 23 is included. Specifically, there is a possibility that the on-resistance may be increased. For example, there is a possibility that a potential barrier may be formed between the third semiconductor region 23 and the fourth semiconductor region 24; and the on-current may be reduced. In contrast, in the semiconductor device 101, the third semiconductor region 23 is not located below the center 20*c* between the fifth semiconductor regions 25. In other words, for example, the third semiconductor region 23 is located only below the fifth semiconductor region 25, i.e., the carrier injection location. In such a case, the increase of the on-resistance can be suppressed compared to the case where the third semiconductor region 23 is located below the center 20*c*. It is considered that this is because, for example, the carrier concentration is relatively high directly under the fifth semiconductor region 25, i.e., the carrier injection location, which suppresses the effects of the potential barrier by the third semiconductor region 23. For example, holes can relatively easily cross the potential barrier when the carrier concentration is high.

As described with reference to FIG. 1, etc., the third semiconductor region 23 and the fifth semiconductor region 25 extend in the Y-direction. That is, the third semiconductor region 23 extends along the fifth semiconductor region 25. Thereby, for example, the oscillation of the recovery voltage can be suppressed while suppressing the effects on the conduction characteristics by the third semiconductor region 23.

For example, as illustrated in FIG. 2, a length W23 along the X-direction of the third semiconductor region 23 is not less than a length W25 along the X-direction of the fifth semiconductor region 25. For example, the oscillation of the recovery voltage can be further suppressed because the third semiconductor region 23 is located in a relatively wide area below the fifth semiconductor region 25. For example, it is considered that the depletion layer in recovery can extend downward at a lower rate. In the example, the length W23 is greater than the length W25; and the two X-direction ends of one fifth semiconductor region 25 are positioned on the third semiconductor region 23. For example, the entire fifth semiconductor region 25 overlaps the third semiconductor region 23 in the Z-direction. However, according to the embodiment, the length W23 may be less than the length W25; and the third semiconductor region 23 may not be located below a portion of one fifth semiconductor region 25. Although not particularly limited, the length W23 is, for example, not less than 1 μm (micrometers) and not more than 50 μm. Although not particularly limited, the length W25 is, for example, not less than m and not more than 50 μm.

For example, the length W23 along the X-direction of the third semiconductor region 23 may be greater than a distance W23*m* between the third semiconductor regions 23 that are next to each other and greater than a distance W25*m* between the fifth semiconductor regions 25 that are next to each other. When the length W23 is long, for example, the oscillation of the recovery voltage can be further suppressed because the third semiconductor region 23 is located in a relatively wide area below the fifth semiconductor region 25. However, the embodiment is not limited to the above; the length W23 along the X-direction of the third semiconductor region 23 may be less than the distance W25*m* between the fifth semiconductor regions 25 *s* that are next to each other and greater than the distance W23*m* between the third semiconductor regions 23 that are next to each other. The effects on the conduction characteristics by the third semiconductor region 23 are easily suppressed when the length W23 is short.

For example, as illustrated in FIG. 2, a length D23 along the Z-direction of the third semiconductor region 23 is greater than a length D24 along the Z-direction of the fourth semiconductor region 24. It is considered that the spreading of the depletion layer in recovery is further suppressed by increasing the length D23 along the Z-direction of the third semiconductor region 23. The oscillation of the recovery voltage can be further suppressed thereby. However, according to the embodiment, the length D24 along the Z-direction of the fourth semiconductor region 24 may be greater than the length D23 along the Z-direction of the third semiconductor region 23. When the length D24 along the Z-direction of the fourth semiconductor region 24 is long, punch-through at the surface of the fourth semiconductor region 24 does not easily occur when the current is blocked by switching from the on-state to the off-state; and the blocking performance is improved. Although not particularly limited, the length D23 is, for example, not less than m and not more than 20 μm. Although not particularly limited, the length D24 is, for example, not less than 2 μm and not more than 10 μm.

Modification

Figure 4:
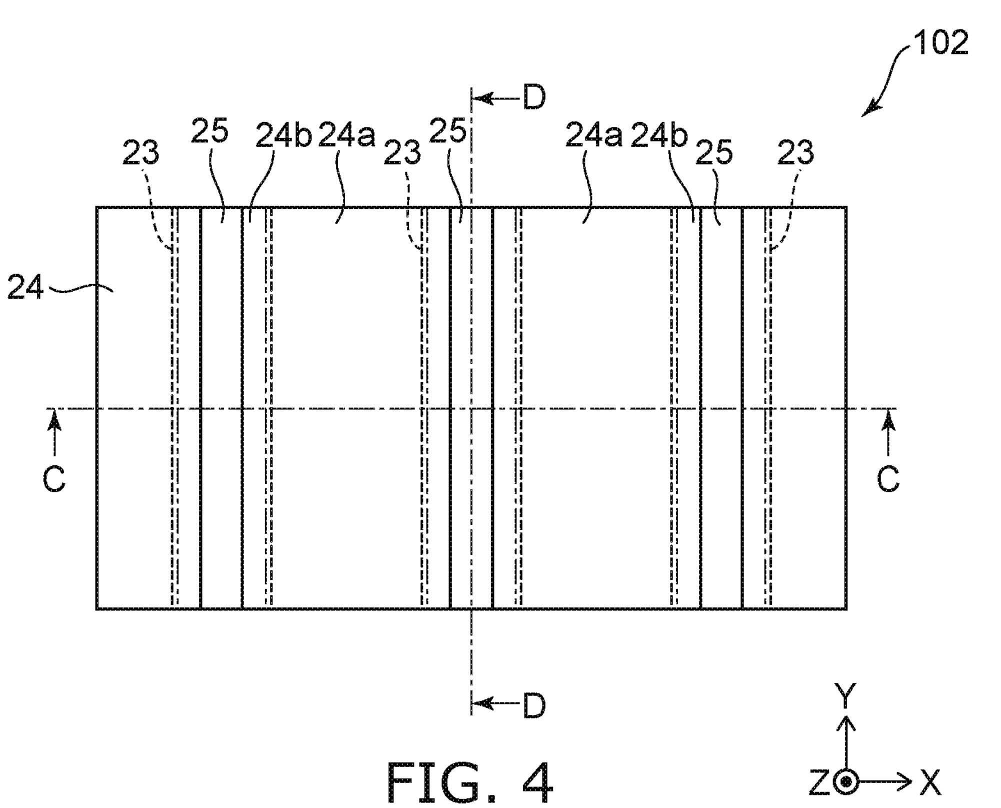
FIG. 4 is a schematic plan view illustrating a semiconductor device according to the first embodiment.

FIG. 4 is a schematic plan view illustrating a semiconductor device according to the first embodiment.

Figure 5:
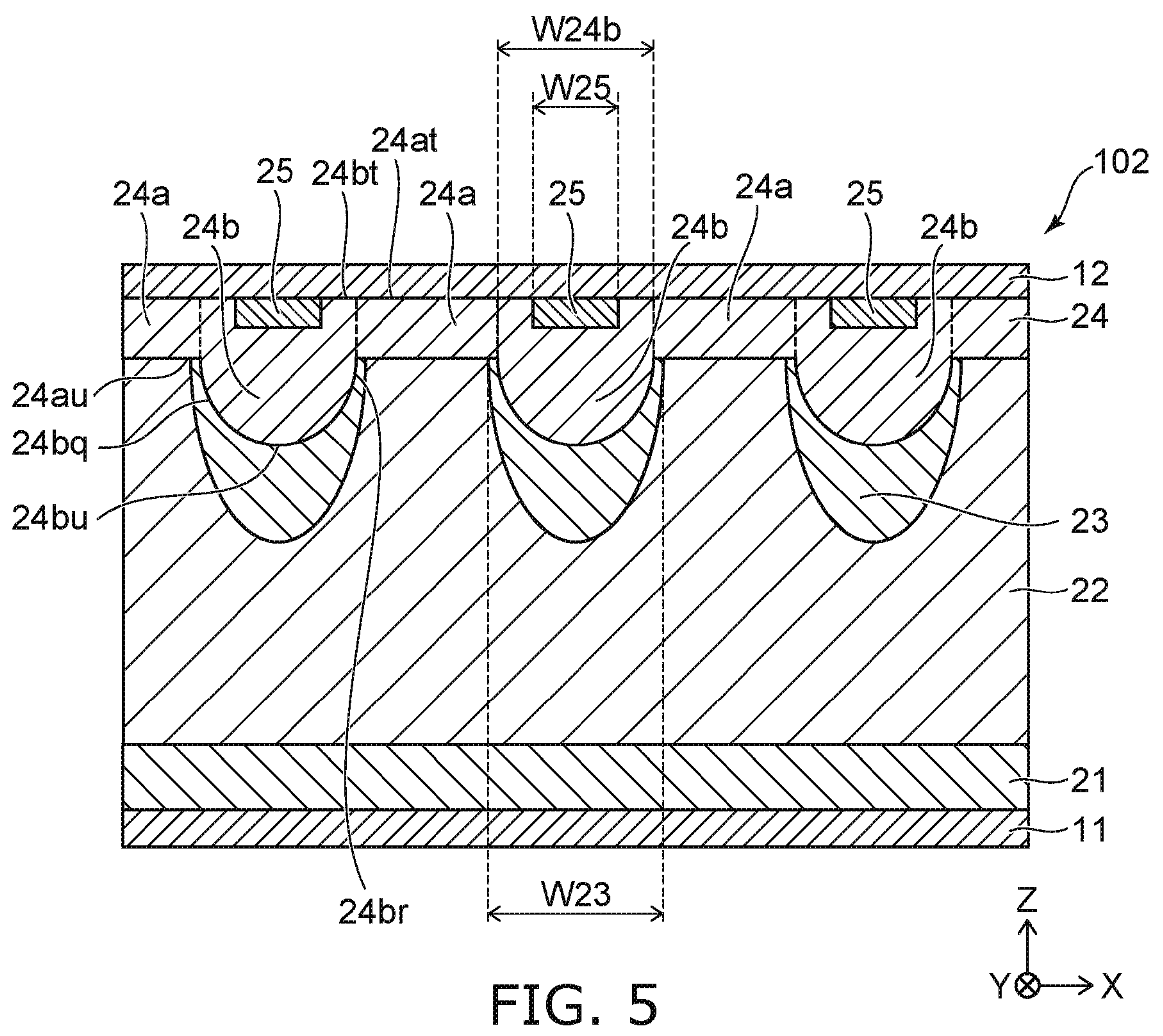
FIG. 5 is a schematic cross-sectional view illustrating the semiconductor device according to the first embodiment.

FIG. 5 is a schematic cross-sectional view illustrating the semiconductor device according to the first embodiment.

Figure 6:
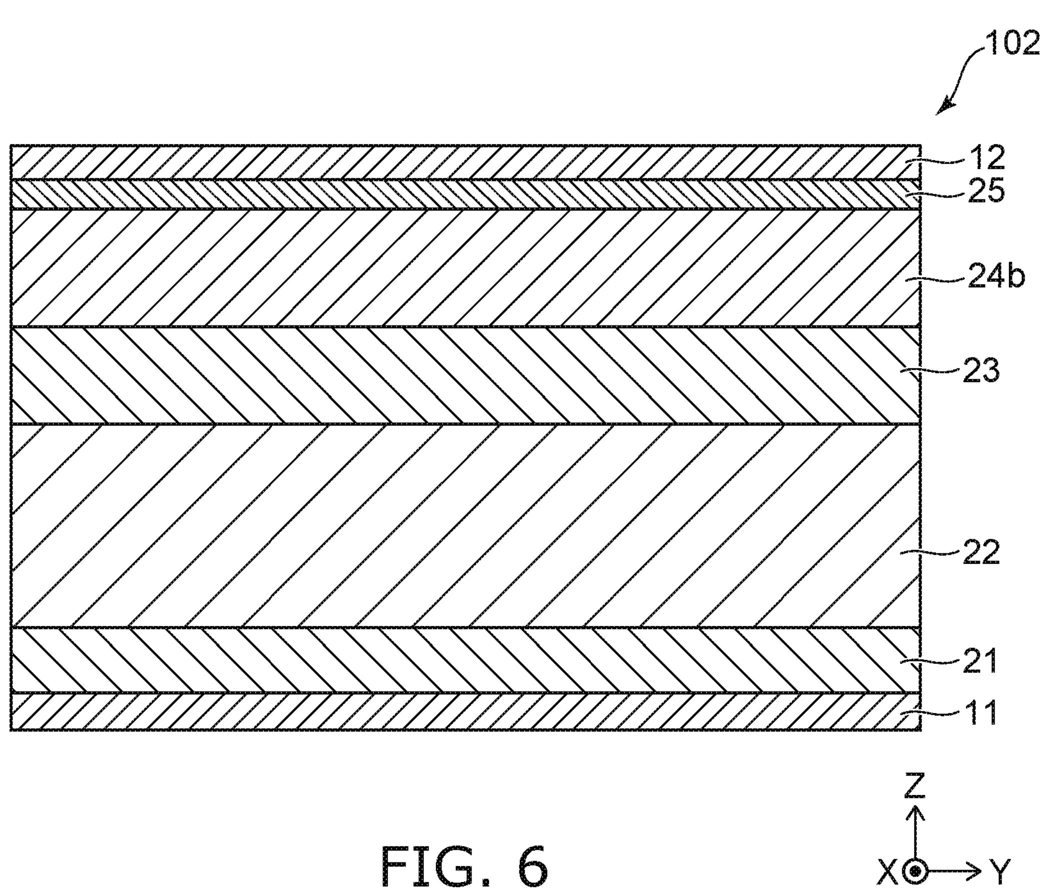
FIG. 6 is a schematic cross-sectional view illustrating the semiconductor device according to the first embodiment.

FIG. 6 is a schematic cross-sectional view illustrating the semiconductor device according to the first embodiment.

FIG. 5 corresponds to a line C-C cross section illustrated in FIG. 4. FIG. 6 corresponds to a line D-D cross section illustrated in FIG. 4. In the semiconductor device 102 according to the embodiment as illustrated in FIGS. 4 to 6, the fourth semiconductor region 24 includes a first region 24*a* and a second region 24*b*. Otherwise, a description similar to the semiconductor device 101 is applicable to the semiconductor device 102.

As illustrated in FIG. 5, the first region 24*a* is arranged with the second region 24*b* in the X-direction. The second region 24*b* is deeper than the first region 24*a*. That is, the Z-direction position of a lower end 24*bu* of the second region 24*b* is lower than the Z-direction position of a lower end 24*au* (the lower surface) of the first region 24*a*. The Z-direction position of an upper end 24*bt* (the upper surface) of the second region 24*b* may be equal to the Z-direction position of an upper end 24*at* (the upper surface) of the first region 24*a*.

At least a portion of the second region 24*b* is positioned between at least a portion of the third semiconductor region 23 and at least a portion of the fifth semiconductor region 25. For example, a length W24*b* in the X-direction of the second region 24*b* is greater than the length W25 in the X-direction of the fifth semiconductor region 25. For example, the entire fifth semiconductor region 25 is located on the second region 24*b*.

In the example, the length W23 in the X-direction of the third semiconductor region 23 is greater than the length W24*b* in the X-direction of the second region 24*b*. For example, as illustrated in FIG. 5, the third semiconductor region 23 may contact side surfaces 24*bq* and 24*br* in the X-direction of the second region 24*b*. The third semiconductor region 23 may contact the lower end 24*au* of the first region 24*a*. However, according to the embodiment, the length W23 may be less than the length W24*b*; and the third semiconductor region 23 may not be located below a portion of the second region 24*b*.

Multiple first regions 24*a* are included. The multiple first regions 24*a* are periodically arranged along the X-direction. Each first region 24*a* extends in the Y-direction. Multiple second regions 24*b* are included. The multiple second regions 24*b* are periodically arranged along the X-direction. The first region 24*a* and the second region 24*b* are alternately arranged along the X-direction. Each second region 24*b* extends in the Y-direction.

The second-conductivity-type impurity concentration in the second region 24*b* may be different from the second-conductivity-type impurity concentration in the first region 24*a*. For example, the second-conductivity-type impurity concentration in the second region 24*b* is greater than the second-conductivity-type impurity concentration in the first region 24*a*.

Thus, in the semiconductor device 102, because a portion of the fourth semiconductor region 24 protrudes downward, punch-through at the surface of the fourth semiconductor region 24 does not easily occur when the current is blocked by switching from the on-state to the off-state; and the blocking performance is improved.

In the semiconductor device 102 as well, similarly to the semiconductor device 101, the oscillation of the recovery voltage can be suppressed.

Figures 7, 8:
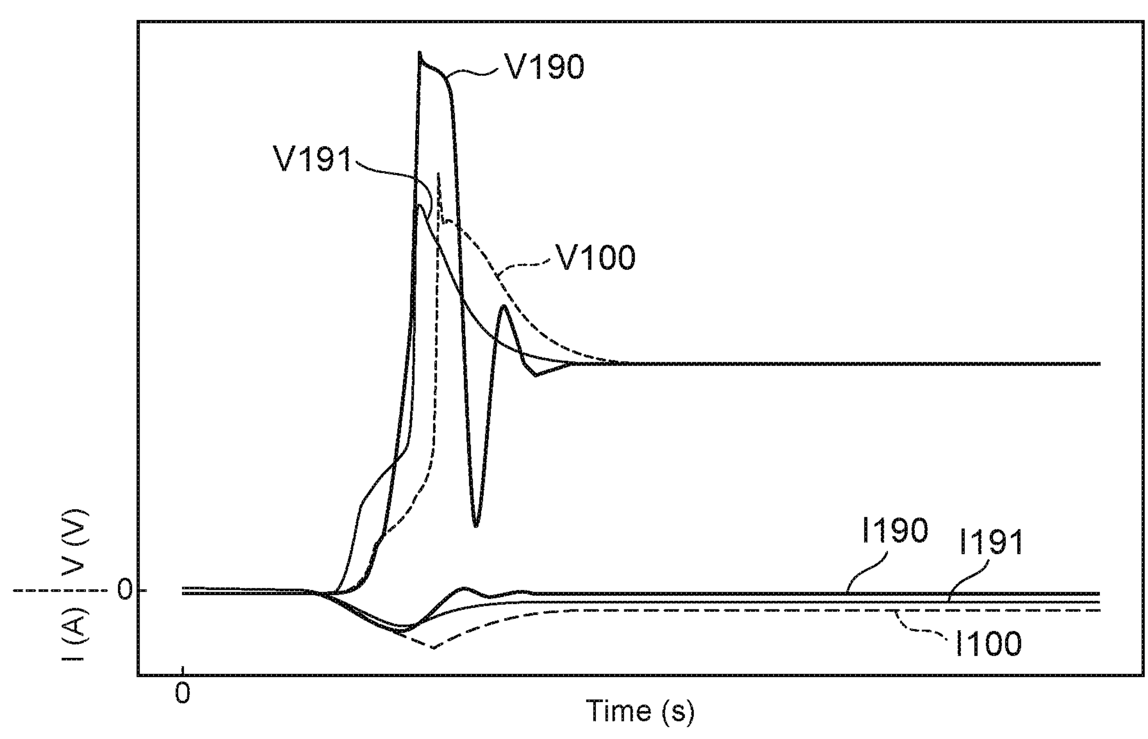
FIG. 7 is a graph illustrating characteristic simulation results of semiconductor devices.
FIG. 8 is a graph illustrating characteristic simulation results of the semiconductor devices.

FIG. 7 is a graph illustrating characteristic simulation results of semiconductor devices.

FIG. 7 illustrates the voltage and the current in recovery for a semiconductor device 100 according to the embodiment (not illustrated) and semiconductor devices 190 and 191 according to reference examples (not illustrated). The semiconductor device 100 is a semiconductor device similar to the semiconductor device 102 described above. The semiconductor device 190 has the configuration of the semiconductor device 100 without the third semiconductor region 23. The semiconductor device 191 has the configuration of the semiconductor device 100 in which the position of the third semiconductor region 23 is shifted in the X-direction. In the semiconductor device 191, the third semiconductor region 23 overlaps the center 20*c* between the fifth semiconductor regions 25 in the Z-direction and does not overlap the fifth semiconductor region 25 in the Z-direction.

The horizontal axis of FIG. 7 is the time (seconds). The range greater than 0 on the vertical axis of FIG. 7 is a voltage V (volts) generated between the first electrode 11 and the second electrode 12. The range less than 0 on the vertical axis of FIG. 7 is a current I (amperes) flowing between the first electrode 11 and the second electrode 12. As illustrated in FIG. 7, oscillations occur in a voltage V190 and a current I190 of the semiconductor device 190. In contrast, compared to the semiconductor device 190, the oscillations are suppressed in a voltage V100 and a current I100 of the semiconductor device 100. In a voltage V191 and a current I191 of the semiconductor device 191 as well, compared to the semiconductor device 190, the oscillations are suppressed. Thus, according to the embodiment, the oscillation of the voltage in recovery can be suppressed by including the third semiconductor region 23.

FIG. 8 is a graph illustrating characteristic simulation results of the semiconductor devices.

FIG. 8 illustrates the on-state characteristics of the semiconductor devices 100, 190, and 191. The vertical axis of FIG. 8 is the current I (amperes) flowing between the first electrode 11 and the second electrode 12. The horizontal axis of FIG. 8 is the voltage V (volts) generated between the first electrode 11 and the second electrode 12.

As illustrated in FIG. 8, a current IF191 of the semiconductor device 191 is much less than a current IF190 of the semiconductor device 190. In contrast, the reduction from the current IF190 is suppressed for a current IF100 of the semiconductor device 100 according to the embodiment. Thus, according to the embodiment, it is favorable for the third semiconductor region 23 not to be located below the center 20*c* between the fifth semiconductor regions 25. The effects on the conduction characteristics when the third semiconductor region 23 is included can be suppressed thereby.

Second Embodiment

Figure 9:
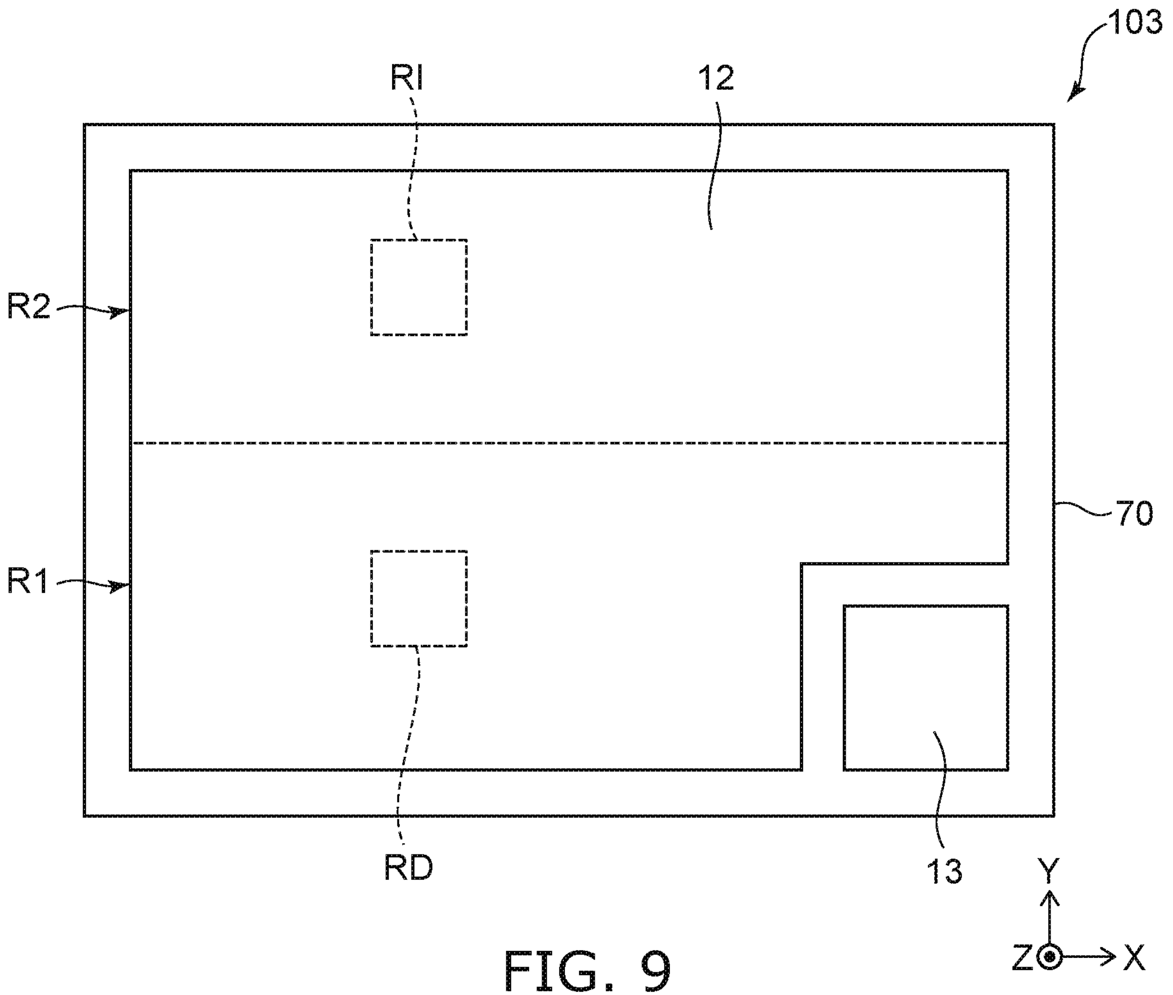
FIG. 9 is a schematic plan view illustrating a semiconductor device according to a second embodiment.

FIG. 9 is a schematic plan view illustrating a semiconductor device according to a second embodiment.

As illustrated in FIG. 9, the semiconductor device 103 of the embodiment includes a first region R1 and a second region R2. The first region R1 is, for example, a diode region in which a diode is provided. The second region R2 is, for example, an IGBT region in which an IGBT (Insulated Gate Bipolar Transistor) is provided. The semiconductor device 103 is, for example, an RC-IGBT (Reverse-Conducting IGBT).

One of each of the first and second regions R1 and R2 are included in FIG. 9. Multiple first regions R1 and multiple second regions R2 may be included. The first region R1 and the second region R2 are arranged in the Y-direction (or the X-direction).

The second electrode 12 and a third electrode 13 (e.g., a gate pad) are located at the upper surface of the semiconductor device 103. A termination insulating film 70 is located at the edge of the upper surface of the semiconductor device 103.

Figure 10:
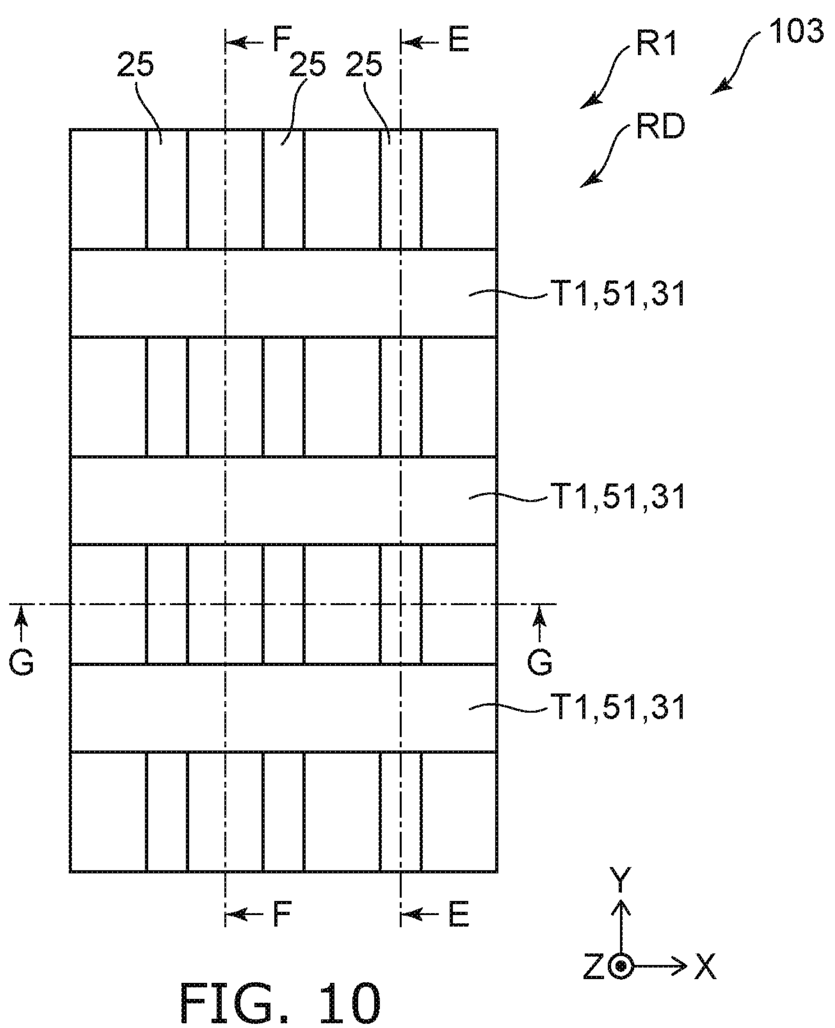
FIG. 10 is a schematic plan view illustrating a portion of the semiconductor device according to the second embodiment.

FIG. 10 is a schematic plan view illustrating a portion of the semiconductor device according to the second embodiment.

Figure 11:
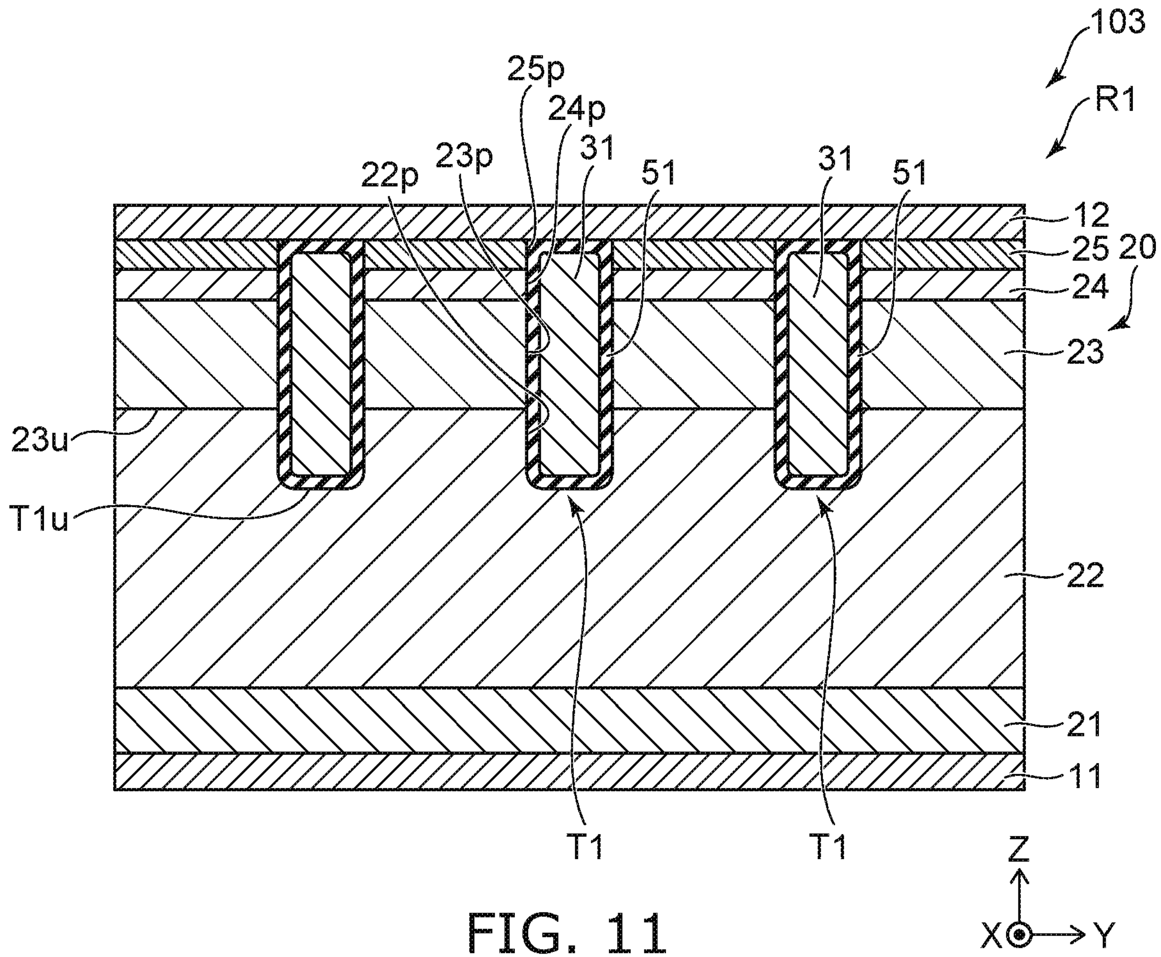
FIG. 11 is a schematic cross-sectional view illustrating the semiconductor device according to the second embodiment.
Figure 12:
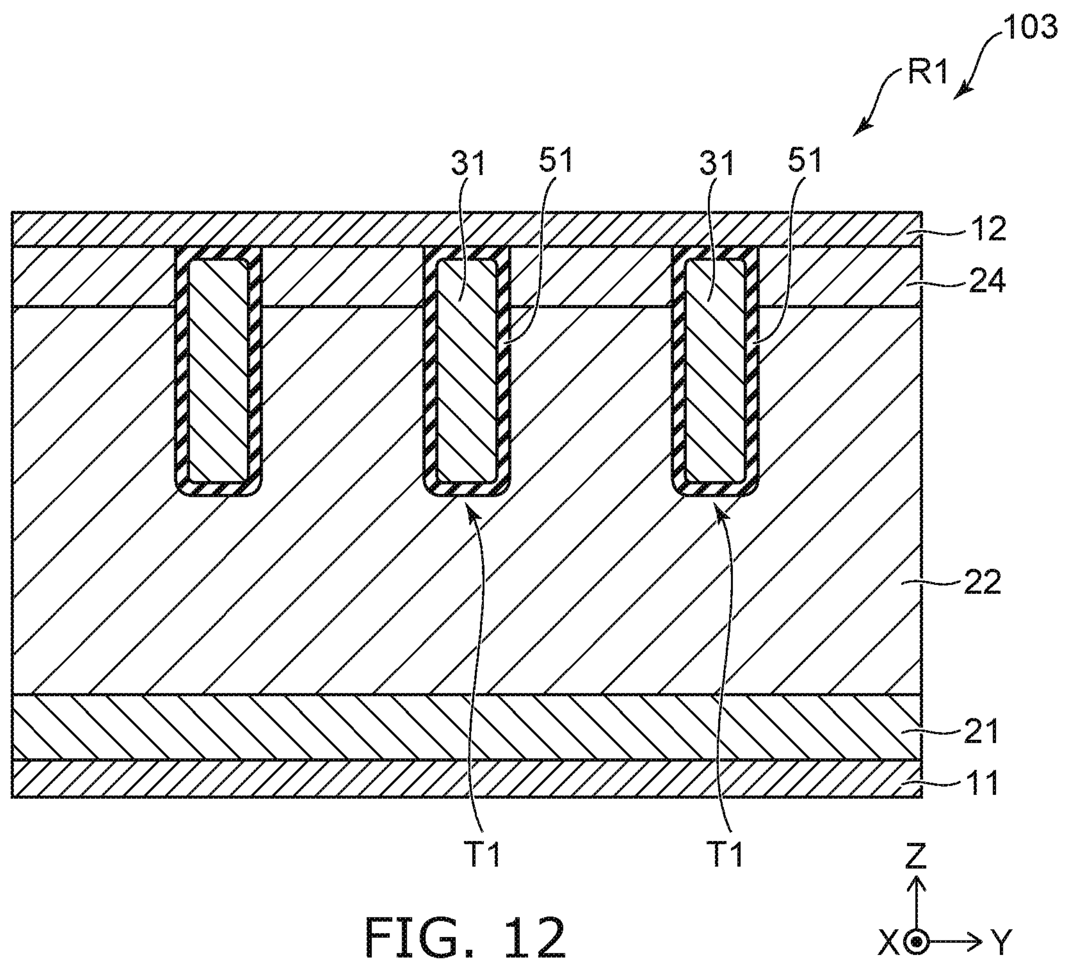
FIG. 12 is a schematic cross-sectional view illustrating the semiconductor device according to the second embodiment.
Figure 13:
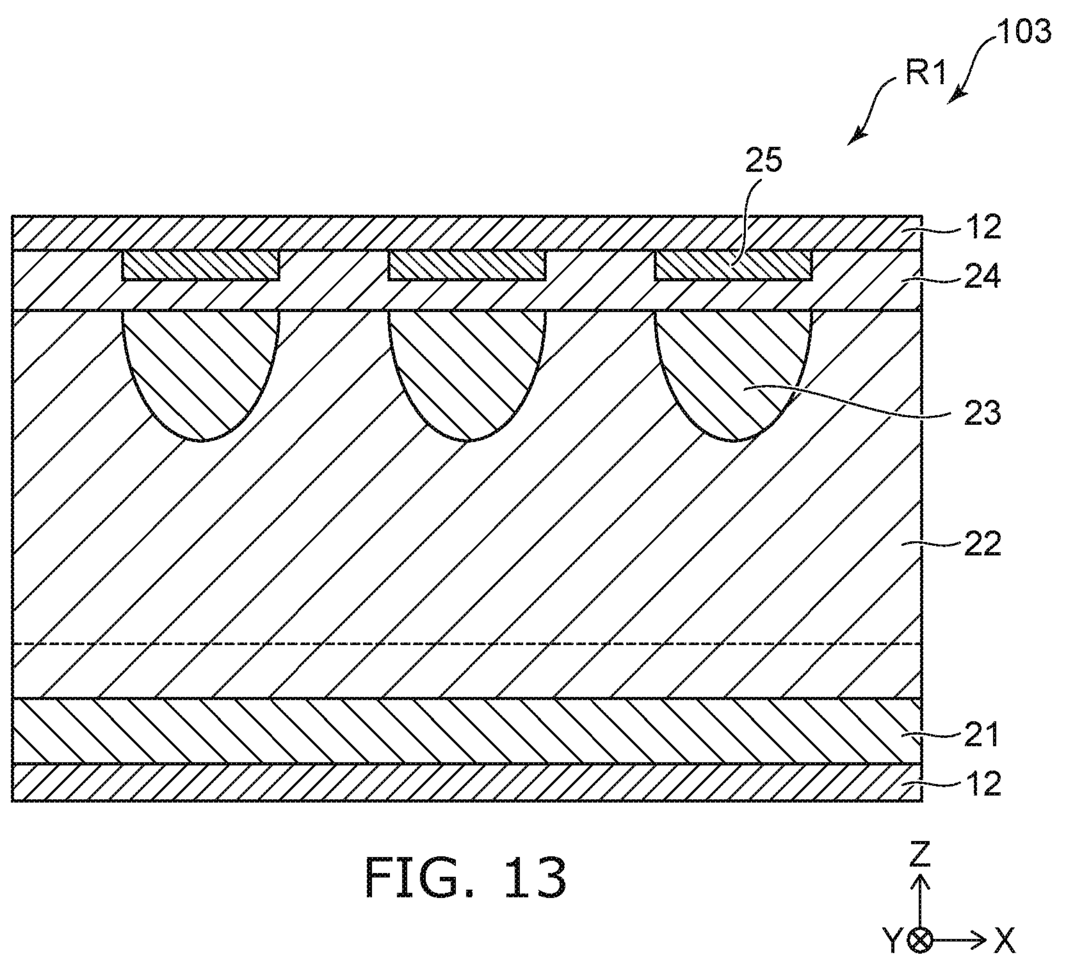
FIG. 13 is a schematic cross-sectional view illustrating the semiconductor device according to the second embodiment.

FIGS. 11 to 13 are schematic cross-sectional views illustrating the semiconductor device according to the second embodiment.

FIG. 10 is an enlarged plan view illustrating a portion RD of the first region R1 shown in FIG. 9. The second electrode 12 is not illustrated in FIG. 10. FIG. 11 corresponds to a line E-E cross section shown in FIG. 10. FIG. 12 corresponds to a line F-F cross section shown in FIG. 10. FIG. 13 corresponds to a line G-G cross section shown in FIG. 10.

The first electrode 11, the first semiconductor region 21, the second semiconductor region 22, the third semiconductor region 23, the fourth semiconductor region 24, the fifth semiconductor region 25, and the second electrode 12 are included in the first region R1 of the semiconductor device 103 as well. The first region R1 of the semiconductor device 103 further includes a first conductive part 31 and a first insulating film 51.

For example, as illustrated in FIG. 11, the first conductive part 31 faces a side surface 22*p* of the second semiconductor region 22, a side surface 23*p* of the third semiconductor region 23, a side surface 24*p* of the fourth semiconductor region 24, and a side surface 25*p* of the fifth semiconductor region 25 via the first insulating film 51. In other words, the first conductive part 31 is arranged in the Y-direction with the side surface 22*p*, the side surface 23*p*, the side surface 24*p*, and the side surface 25*p*. The first insulating film 51 is located between the first conductive part 31 and the side surfaces (the side surface 22*p*, the side surface 23*p*, the side surface 24*p*, and the side surface 25*p*). The first insulating film 51 contacts the first conductive part 31 and the side surfaces (the side surface 22*p*, the side surface 23*p*, the side surface 24*p*, and the side surface 25*p*). The side surface 22*p*, the side surface 23*p*, the side surface 24*p*, and the side surface 25*p* each cross the Y-direction and extend along the Z-X plane.

The first conductive part 31 is electrically connected with the second electrode 12 positioned above the first conductive part 31. For example, the potential of the first conductive part 31 is set to be equal to the potential of the second electrode 12.

A first trench T1 is provided in the semiconductor layer 20. The first trench T1 is a recess that extends downward from the surface of the semiconductor layer 20 (the upper surface 24*t* of the fourth semiconductor region 24 and the upper surface 25*t* of the fifth semiconductor region 25) and reaches the second semiconductor region 22. The first insulating film 51 is located at the inner surface of the first trench T1; and the first conductive part 31 is located inside the first insulating film 51.

Pluralities of each of the first trench T1, the first insulating film 51, and the first conductive part 31 are included. The multiple first trenches T1 are periodically arranged along the Y-direction. The first trenches T1 extend in the X-direction.

The multiple first insulating films 51 are periodically arranged along the Y-direction. The first insulating films 51 are located at the inner walls of the first trenches T1 and extend in the X-direction.

The multiple first conductive parts 31 are periodically arranged along the Y-direction. The first conductive parts 31 are located inside the first trenches T1 and the first insulating films 51 and extend in the X-direction.

For example, as illustrated in FIG. 10, the fifth semiconductor region 25 that extends in the Y-direction is divided by the first trench T1 into multiple portions separated from each other in the Y-direction. Similarly, the third semiconductor region 23 that extends in the Y-direction is divided by the first trench T1 into multiple portions separated from each other in the Y-direction.

Figure 14:
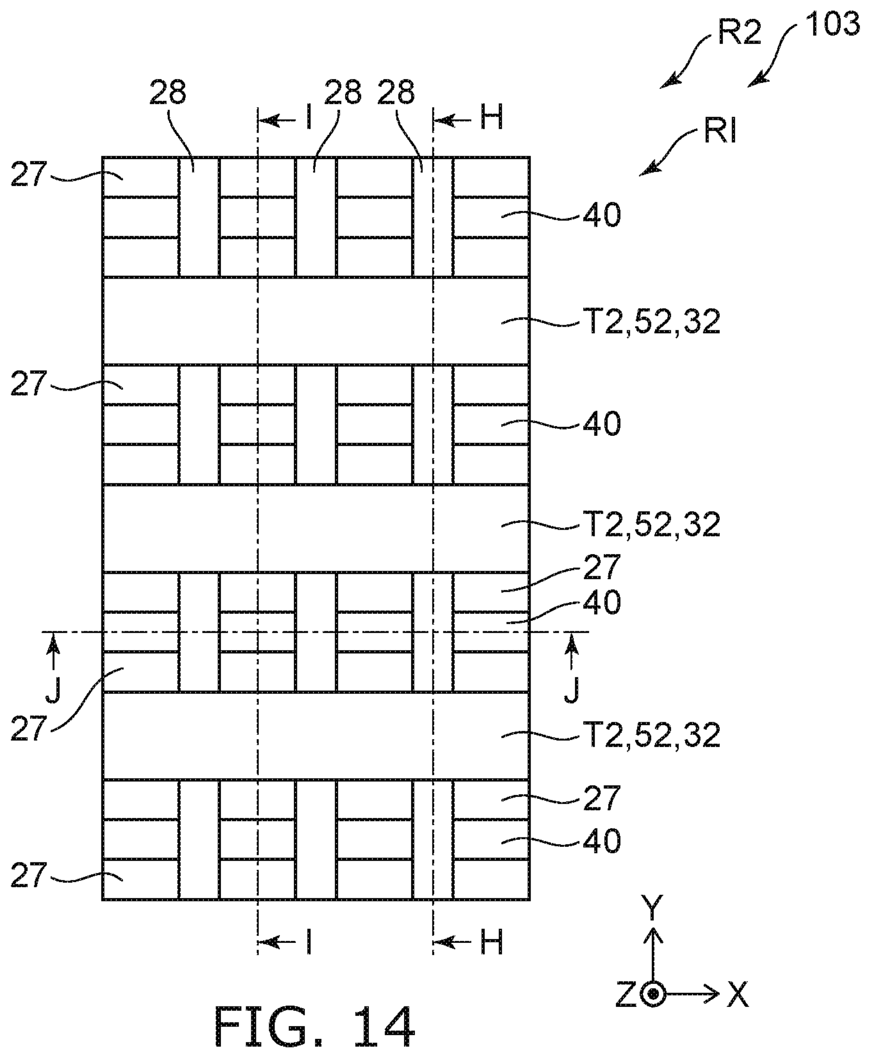
FIG. 14 is a schematic plan view illustrating a portion of the semiconductor device according to the second embodiment.

FIG. 14 is a schematic plan view illustrating a portion of the semiconductor device according to the second embodiment.

Figure 15:
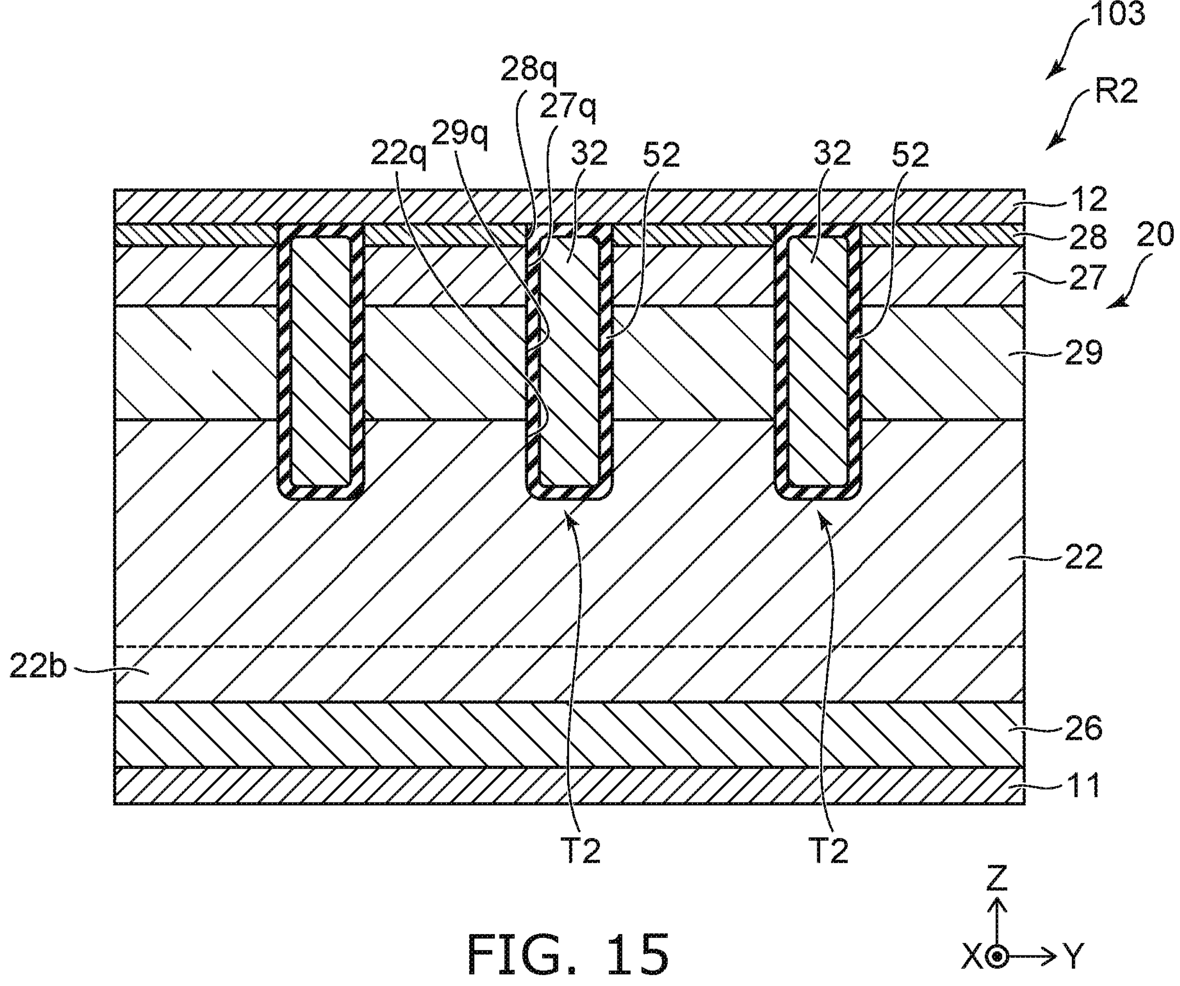
FIG. 15 is a schematic cross-sectional view illustrating the semiconductor device according to the second embodiment.
Figure 16:
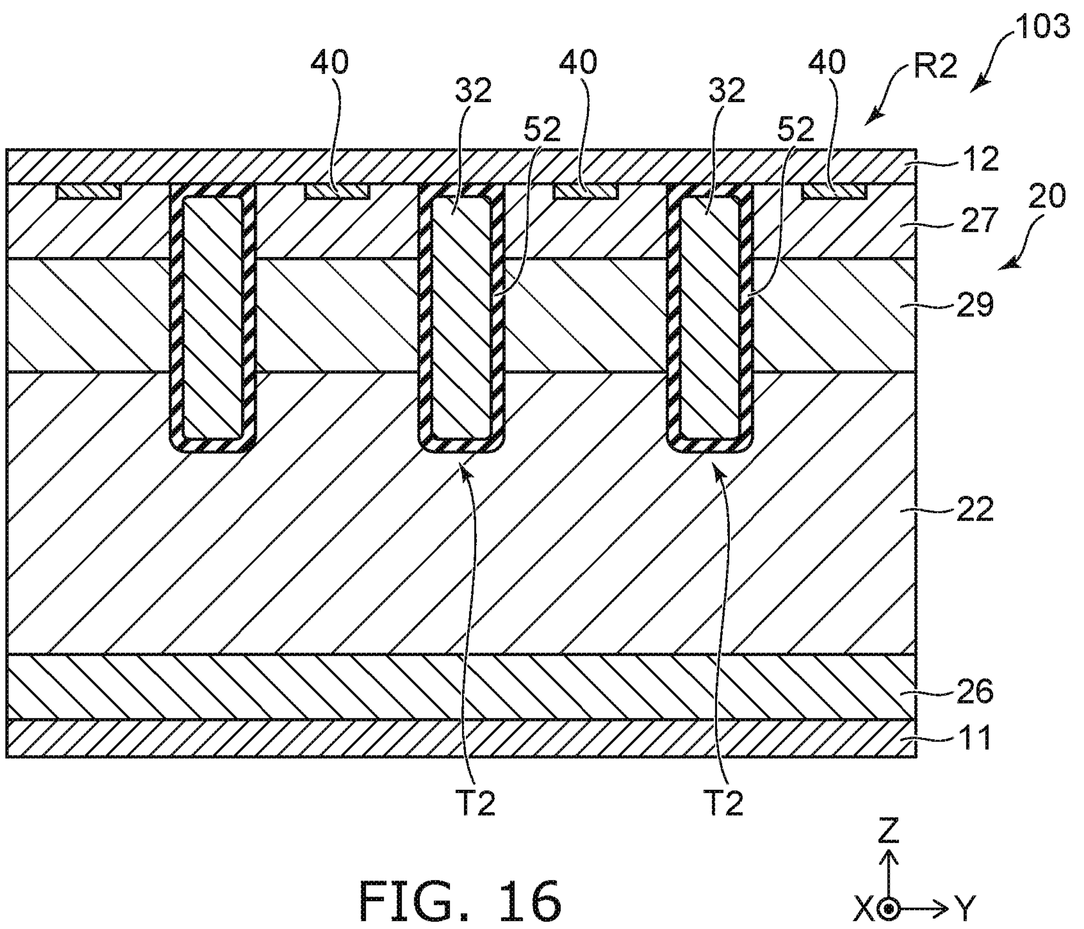
FIG. 16 is a schematic cross-sectional view illustrating the semiconductor device according to the second embodiment.
Figure 17:
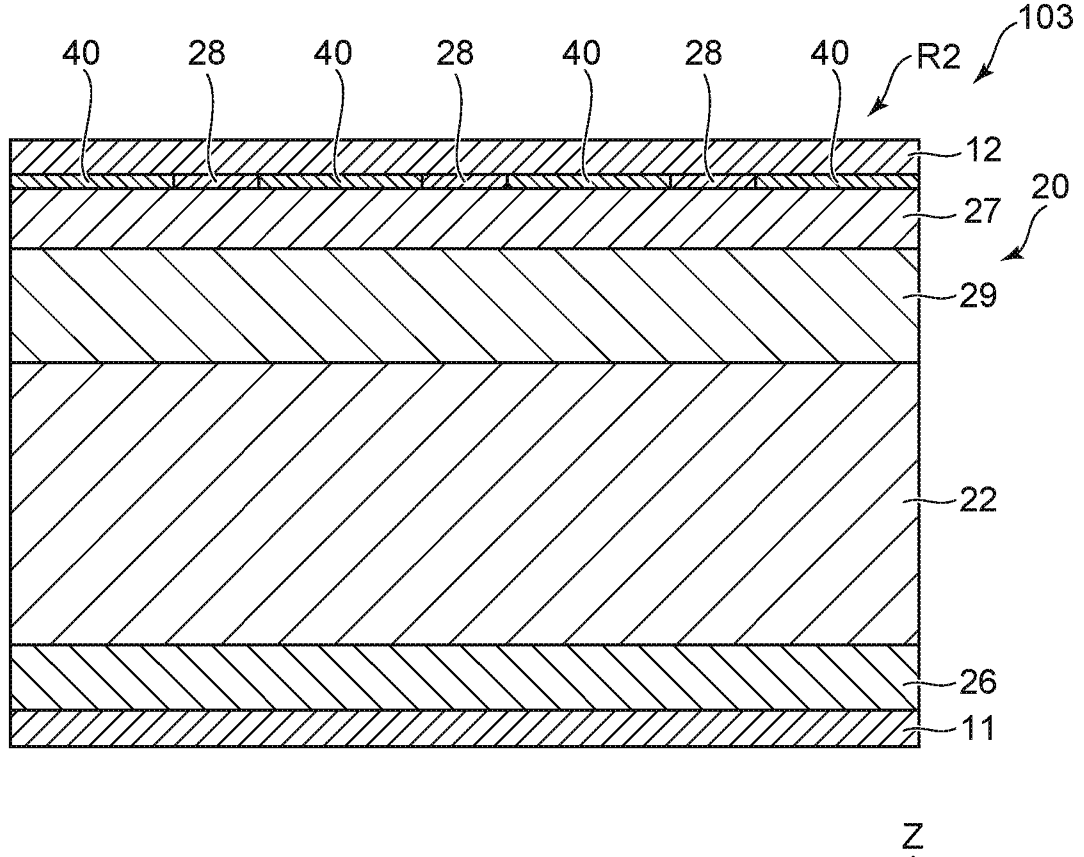
FIG. 17 is a schematic cross-sectional view illustrating the semiconductor device according to the second embodiment.

FIGS. 15 to 17 are schematic cross-sectional views illustrating the semiconductor device according to the second embodiment.

FIG. 14 is an enlarged plan view of a portion RI of the second region R2 shown in FIG. 9. The second electrode 12 is not illustrated in FIG. 14. FIG. 15 corresponds to a line H-H cross section shown in FIG. 14. FIG. 16 corresponds to a line I-I cross section shown in FIG. 14. FIG. 17 corresponds to a line J-J cross section shown in FIG. 14.

For example, as illustrated in FIG. 15, the first electrode 11, the second electrode 12, and the second semiconductor region 22 also are located in the second region R2. That is, the first electrode 11, the second electrode 12, and the second semiconductor region 22 extend over the first region R1 and the second region R2 and are continuous from the first region R1 to the second region R2.

For example, the first electrode 11 functions as a cathode electrode in the first region R1 and functions as a collector electrode in the second region R2. For example, the second electrode 12 functions as an anode electrode in the first region R1 and functions as an emitter electrode in the second region R2.

For example, as illustrated in FIG. 15, the second region R2 of the semiconductor device 103 further includes a sixth semiconductor region 26 (a collector region), a seventh semiconductor region 27 (a base region), an eighth semiconductor region 28 (an emitter region), a semiconductor region 29 (a barrier region), a second insulating film 52 (a gate insulating film), and a second conductive part 32 (a gate electrode). For example, as illustrated in FIG. 16, the second region R2 of the semiconductor device 103 further includes a semiconductor region 40. The semiconductor regions are portions of the semiconductor layer 20 (the semiconductor substrate).

The sixth semiconductor region 26 is located between the first electrode 11 and the second semiconductor region 22 and electrically connected with the second semiconductor region 22 and the first electrode 11. The semiconductor region 22*b* (the buffer region) may be located between the sixth semiconductor region 26 and the second semiconductor region 22. For example, the sixth semiconductor region 26 contacts the second semiconductor region 22 (or the semiconductor region 22*b*) and the first electrode 11. The sixth semiconductor region 26 is of the second conductivity type.

The semiconductor region 29 is located on the second semiconductor region 22 and electrically connected with the second semiconductor region 22. The semiconductor region 29 contacts the second semiconductor region 22. The semiconductor region 29 is of the first conductivity type. The first-conductivity-type impurity concentration of the semiconductor region 29 is greater than the first-conductivity-type impurity concentration of the second semiconductor region 22.

The seventh semiconductor region 27 is located on the semiconductor region 29 and electrically connected with the semiconductor region 29. That is, the seventh semiconductor region 27 is located above the sixth semiconductor region 26 and on the second semiconductor region 22 and is electrically connected with the second semiconductor region 22. The seventh semiconductor region is of the second conductivity type.

The eighth semiconductor region 28 is located on a portion of the seventh semiconductor region 27 and electrically connected with the seventh semiconductor region 27. The eighth semiconductor region 28 contacts the seventh semiconductor region 27. The eighth semiconductor region 28 is of the first conductivity type. The first-conductivity-type impurity concentration of the eighth semiconductor region 28 is greater than the first-conductivity-type impurity concentration of the second semiconductor region 22 and greater than the impurity concentration of the semiconductor region 29.

As illustrated in FIG. 16, the semiconductor region 40 is located on a portion of the seventh semiconductor region 27 and electrically connected with the seventh semiconductor region 27. The semiconductor region 40 contacts the seventh semiconductor region 27. The semiconductor region 40 is of the second conductivity type. The second-conductivity-type impurity concentration of the semiconductor region 40 is greater than the second-conductivity-type impurity concentration of the seventh semiconductor region 27.

As illustrated in FIGS. 15 and 16, the second electrode 12 is located on the seventh semiconductor region 27, the eighth semiconductor region 28, and the semiconductor region 40 and electrically connected with the seventh semiconductor region 27, the eighth semiconductor region 28, and the semiconductor region 40. The second electrode 12 contacts the seventh semiconductor region 27, the eighth semiconductor region 28, and the semiconductor region 40.

For example, as illustrated in FIG. 15, the second conductive part 32 faces a side surface 22*q* of the second semiconductor region 22, a side surface 29*q* of the semiconductor region 29, a side surface 27*q* of the seventh semiconductor region 27, and a side surface 28*q* of the eighth semiconductor region 28 via the second insulating film 52. In other words, the second conductive part 32 is arranged in the Y-direction with the side surface 22*q*, the side surface 29*q*, the side surface 27*q*, and the side surface 28*q*. The second insulating film 52 is located between the second conductive part 32 and the side surfaces (the side surface 22*q*, the side surface 29*q*, the side surface 27*q*, and the side surface 28*q*). The first insulating film 51 contacts the second conductive part 32 and the side surfaces (the side surface 22*q*, the side surface 29*q*, the side surface 27*q*, and the side surface 28*q*). The side surface 22*q*, the side surface 29*q*, the side surface 27*q*, and the side surface 28*q* each cross the Y-direction and extend along the Z-X plane.

The second conductive part 32 is electrically connected with the third electrode 13 shown in FIG. 13. For example, the potential of the second conductive part 32 is set to be equal to the potential of the third electrode 13. A voltage can be applied to the second conductive part 32 via the third electrode 13. The second conductive part 32 is insulated from the second electrode 12.

A second trench T2 is provided in the semiconductor layer 20. The second trench T2 is a recess that extends downward from the surface of the semiconductor layer 20 (the upper surface of the seventh semiconductor region 27 and the upper surface of the eighth semiconductor region 28) and reaches the second semiconductor region 22 in the second region R2. The second insulating film 52 is located at the inner surface of the second trench T2; and the second conductive part 32 is located inside the second insulating film 52.

Pluralities of the eighth semiconductor region 28, the semiconductor region 40, the second trench T2, the second insulating film 52, and the second conductive part 32 are included.

The multiple eighth semiconductor regions 28 are periodically arranged along the X-direction. The eighth semiconductor regions 28 extend in the Y-direction.

The multiple semiconductor regions 40 are periodically arranged along the Y-direction. The semiconductor regions 40 extend in the X-direction.

The multiple second trenches T2 are periodically arranged along the Y-direction. The second trenches T2 extend in the X-direction. One semiconductor region 40 is located between two second trenches T2 that are next to each other when viewed from above. In other words, the second trench and the semiconductor region 40 are alternately arranged in the Y-direction.

The multiple second insulating films 52 are periodically arranged along the Y-direction. The second insulating films 52 are located at the inner walls of the second trenches T2 and extend in the X-direction.

The multiple second conductive parts 32 are periodically arranged along the Y-direction. The second conductive parts 32 are located inside the second trenches T2 and the second insulating films 52 and extend in the X-direction.

For example, as illustrated in FIG. 14, the eighth semiconductor region 28 that extends in the Y-direction is divided by the second trench T2 into multiple portions separated from each other in the Y-direction. The semiconductor region 40 that extends in the X-direction is divided by the eighth semiconductor region 28 into multiple portions separated from each other in the X-direction.

Materials of the components of the semiconductor device 103 will now be described.

The sixth semiconductor region 26, the seventh semiconductor region 27, the eighth semiconductor region 28, the semiconductor region 29, and the semiconductor region 40 include silicon, silicon carbide, gallium nitride, or gallium arsenide as semiconductor materials. When silicon is used as the semiconductor material, arsenic, phosphorus, or antimony can be used as the n-type impurity. Boron can be used as the p-type impurity.

The first conductive part 31 and the second conductive part 32 include conductive materials such as metal materials, polysilicon, etc. An impurity may be added to the conductive material.

The first insulating film 51 and the second insulating film 52 include insulating materials such as silicon oxide, silicon nitride, etc.

The material of the third electrode 13 may be similar to the material of the second electrode 12.

Operations of the semiconductor device 103 will now be described.

The first region R1 operates as a diode similarly to the description related to the semiconductor device 101.

The second region R2 operates as an IGBT. Specifically, a voltage that is not less than a threshold is applied to the second conductive part 32 in a state in which a positive voltage with respect to the second electrode 12 is applied to the first electrode 11. Thereby, a channel is formed in the seventh semiconductor region 27; and the IGBT is switched on. When electrons pass through the channel and flow toward the second semiconductor region 22, holes are injected from the sixth semiconductor region 26 into the second semiconductor region 22. Conductivity modulation in the second semiconductor region 22 greatly reduces the electrical resistance of the semiconductor device 103. Subsequently, when the voltage that is applied to the second conductive part 32 drops below the threshold, the channel in the seventh semiconductor region 27 disappears; and the IGBT is switched off.

By including the semiconductor region 29, the potential barrier to holes between the second semiconductor region 22 and the seventh semiconductor region 27 is increased. The movement of the holes into the seventh semiconductor region 27 can be suppressed thereby; the density of the electrons and holes inside the second semiconductor region 22 when turning on the IGBT can be increased; and the on-resistance can be reduced.

Effects of the semiconductor device 103 will now be described.

In the first region R1 of the semiconductor device 103 as well, at least a portion of the third semiconductor region 23 is located below at least a portion of the fifth semiconductor region 25. Thereby, similarly to the description related to the semiconductor device 101, the oscillation of the recovery voltage of the diode can be suppressed in the semiconductor device 103 as well.

For example, when reverse-biased, i.e., when a positive voltage with respect to the second electrode 12 is applied to the first electrode 11, the electric field of the p-n junction between the third semiconductor region 23 and the fourth semiconductor region 24 is stronger than the electric field of the p-n junction between the second semiconductor region 22 and the fourth semiconductor region 24. For example, when the third semiconductor region 23 is included, there is a possibility that punch-through may easily occur at the surface of the fourth semiconductor region 24 when reverse-biased. That is, there is a risk that the breakdown voltage of the semiconductor device 103 may be reduced when the third semiconductor region 23 is included.

In contrast, by including the first conductive part 31 and the first insulating film 51, the depletion layer spreads from the lower end vicinity of the first insulating film 51 toward the second semiconductor region 22 when reverse-biased. For example, the electric field at the vicinity of the lower end of the first insulating film 51 (the corner portion of the first trench T1) increases, and electric field concentration at the p-n junction vicinity can be suppressed. Accordingly, by including the first conductive part 31 and the first insulating film 51 (the first trench T1), the reduction of the breakdown voltage of the semiconductor device 103 can be suppressed. For example, as illustrated in FIG. 11, it is desirable for the Z-direction position of a lower end T1*u* of the first trench T1 to be lower than the Z-direction position of the lower end (the bottom surface 23*u*) of the third semiconductor region 23. In other words, the first trench T1 is deeper than the third semiconductor region 23. The depth of the first trench T1 may be substantially equal to the depth of the second trench T2.

The third semiconductor region 23 extends in the Y-direction. On the other hand, as described with reference to FIG. 10, the first trench T1 extends in the X-direction. That is, the first trench T1 crosses (e.g., is orthogonal to) the third semiconductor region 23. Thereby, one first trench T1 can contact the multiple third semiconductor regions 23. Accordingly, the reduction of the breakdown voltage of the semiconductor device 103 can be suppressed even when the multiple third semiconductor regions 23 are included. The third semiconductor region 23 contacts the multiple first trenches T1 arranged in the Y-direction. Accordingly, for example, the reduction of the breakdown voltage of the semiconductor device 103 along the Y-direction can be suppressed.

In each of the embodiments described above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The relative levels of the impurity concentrations between the semiconductor regions can be considered to be equivalent to the relative levels of the carrier concentrations between the semiconductor regions. The impurity concentration in each semiconductor region can be measured by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:

a first electrode;

a first semiconductor region located on the first electrode and electrically connected with the first electrode, the first semiconductor region being of a first conductivity type;

a second semiconductor region located on the first semiconductor region, the second semiconductor region being of the first conductivity type and having a lower first-conductivity-type impurity concentration than the first semiconductor region;

a third semiconductor region located on a portion of the second semiconductor region, the third semiconductor region being of the first conductivity type and having a higher first-conductivity-type impurity concentration than the second semiconductor region;

a fourth semiconductor region located on the second semiconductor region and on the third semiconductor region, the fourth semiconductor region being of a second conductivity type;

a fifth semiconductor region located on a portion of the fourth semiconductor region, the fifth semiconductor region being of the second conductivity type and having a higher second-conductivity-type impurity concentration than the fourth semiconductor region, at least a portion of the fifth semiconductor region being positioned above at least a portion of the third semiconductor region; and a second electrode located on the fifth semiconductor region and electrically connected with the fifth semiconductor region, the third semiconductor region and the fifth semiconductor region extending in a second direction perpendicular to a first direction, the first direction being from the first electrode toward the second electrode, the fourth semiconductor region including a plurality of first regions and a plurality of second regions that are alternately arranged in a third direction perpendicular to the first direction and the second direction, lower ends of the second regions being lower than lower ends of the first regions, at least a portion of one of the second regions being positioned between the fifth semiconductor region and the third semiconductor region in the first direction, opposite ends of the one of the second regions in the third direction being in contact with adjacent two of the first regions, respectively, wherein a plurality of the third semiconductor regions is included, a plurality of the fifth semiconductor regions is included, and the plurality of third semiconductor regions is not located below centers of regions between mutually-adjacent fifth semiconductor regions among the plurality of fifth semiconductor regions.

2. The semiconductor device according to claim 1, wherein a length of the third semiconductor region in the third direction is not less than a length of the fifth semiconductor region in the third direction.

3. The semiconductor device according to claim 1, further comprising:

a first conductive part and a first insulating film, the first conductive part facing a side surface of the third semiconductor region, a side surface of the fourth semiconductor region, and a side surface of the fifth semiconductor region via the first insulating film.

4. The semiconductor device according to claim 1, further comprising:

a sixth semiconductor region located between the first electrode and the second semiconductor region and electrically connected with the first electrode, the sixth semiconductor region being of the second conductivity type;

a seventh semiconductor region located above the sixth semiconductor region and on the second semiconductor region, the seventh semiconductor region being electrically connected with the second semiconductor region and being of the second conductivity type;

an eighth semiconductor region located on a portion of the seventh semiconductor region and electrically connected with the second electrode, the eighth semiconductor region being of the first conductivity type; and a second conductive part facing a side surface of the second semiconductor region, a side surface of the seventh semiconductor region, and a side surface of the eighth semiconductor region via a second insulating film.

5. The semiconductor device according to claim 1, wherein a length of the third semiconductor region in the third direction is not less than a length of the fifth semiconductor region in the third direction.

6. The semiconductor device according to claim 1, wherein a length of the third semiconductor region in the third direction is greater than a distance between two of the third semiconductor regions that are next to each other.

7. The semiconductor device according to claim 5, wherein a length of an upper surface of the third semiconductor region in the third direction is greater than a length of a bottom surface of the third semiconductor region in the third direction.

8. The semiconductor device according to claim 1, wherein a length of the third semiconductor region in the first direction is greater than a length of the fourth semiconductor region in the first direction.

9. The semiconductor device according to claim 8, wherein the length of the third semiconductor region in the first direction is not less than 5 μm and not more than 20 μm, and the length of the fourth semiconductor region in the first direction is not less than 2 μm and not more than 10 μm.

10. A semiconductor device, comprising:

a first electrode;

a first semiconductor region located on the first electrode and electrically connected with the first electrode, the first semiconductor region being of a first conductivity type;

a second semiconductor region located on the first semiconductor region, the second semiconductor region being of the first conductivity type and having a lower first-conductivity-type impurity concentration than the first semiconductor region;

a plurality of third semiconductor regions located on a portion of the second semiconductor region, the third semiconductor regions being of the first conductivity type and having a higher first-conductivity-type impurity concentration than the second semiconductor region;

a fourth semiconductor region located on the second semiconductor region and on the third semiconductor regions, the fourth semiconductor region being of a second conductivity type;

a plurality of fifth semiconductor regions located on a portion of the fourth semiconductor region, the fifth semiconductor regions being of the second conductivity type and having a higher second-conductivity-type impurity concentration than the fourth semiconductor region, at least a portion of one of the fifth semiconductor regions being positioned above at least a portion of one of the third semiconductor regions; and a second electrode located on the fifth semiconductor region and electrically connected with the fifth semiconductor region, the third semiconductor regions and the fifth semiconductor regions extending in a second direction perpendicular to a first direction, the first direction being from the first electrode toward the second electrode, a length of an upper surface of each of the third semiconductor regions in a third direction perpendicular to the first direction and the second direction, being greater than a distance between two of the third semiconductor regions that are next to each other, the length of the upper surface of each of the third semiconductor regions in the third direction being greater than a length of a bottom surface of the third semiconductor region in the third direction.

11. The semiconductor device according to claim 10, wherein the plurality of third semiconductor regions is not located below centers of regions between mutually-adjacent fifth semiconductor regions among the plurality of fifth semiconductor regions.

12. The semiconductor device according to claim 10, wherein a length of each of the third semiconductor regions in the third direction is not less than a length of a corresponding one of the fifth semiconductor regions in the third direction.

13. The semiconductor device according to claim 10, wherein the fourth semiconductor region includes a first region and a second region, a lower end of the second region is lower than a lower end of the first region, and at least a portion of the second region is positioned between one of the fifth semiconductor regions and one of the third semiconductor regions in the first direction.

14. The semiconductor device according to claim 10, wherein a length of each of the third semiconductor regions in the third direction is not less than a length of a corresponding one of the fifth semiconductor regions in the third direction.

15. The semiconductor device according to claim 10, wherein a length of each of the third semiconductor regions in the first direction is greater than a length of a corresponding one of the fourth semiconductor regions in the first direction.

16. The semiconductor device according to claim 15, wherein the length of each of the third semiconductor regions in the first direction is not less than 5 μm and not more than 20 μm, and the length of the fourth semiconductor region in the first direction is not less than 2 μm and not more than 10 μm.

17. A semiconductor device, comprising:

a first electrode;

a first semiconductor region located on the first electrode and electrically connected with the first electrode, the first semiconductor region being of a first conductivity type;

a second semiconductor region located on the first semiconductor region, the second semiconductor region being of the first conductivity type and having a lower first-conductivity-type impurity concentration than the first semiconductor region;

a third semiconductor region located on a portion of the second semiconductor region, the third semiconductor region being of the first conductivity type and having a higher first-conductivity-type impurity concentration than the second semiconductor region;

a fourth semiconductor region located on the second semiconductor region and on the third semiconductor region, the fourth semiconductor region being of a second conductivity type;

a fifth semiconductor region located on a portion of the fourth semiconductor region, the fifth semiconductor region being of the second conductivity type and having a higher second-conductivity-type impurity concentration than the fourth semiconductor region, at least a portion of the fifth semiconductor region being positioned above at least a portion of the third semiconductor region; and a second electrode located on the fifth semiconductor region and electrically connected with the fifth semiconductor region, the third semiconductor region and the fifth semiconductor region extending in a second direction perpendicular to a first direction, the first direction being from the first electrode toward the second electrode, the fourth semiconductor region including a plurality of first regions and a plurality of second regions that are alternately arranged in a third direction perpendicular to the first direction and the second direction, lower ends of the second regions being lower than lower ends of the first regions, at least a portion of one of the second regions being positioned between the fifth semiconductor region and the third semiconductor region in the first direction, opposite ends of the one of the second regions in the third direction being in contact with adjacent two of the first regions, respectively, wherein a plurality of the third semiconductor regions is included, and a length of the third semiconductor region in the third direction is greater than a distance between two of the third semiconductor regions that are next to each other.

* * * * *